(12) United States Patent
Chang

(10) Patent No.: US 11,385,675 B2
(45) Date of Patent: Jul. 12, 2022

(54) MULTI-CHIP SYSTEM, CHIP, AND CLOCK SYNCHRONIZATION METHOD

(71) Applicant: REALTEK SEMICONDUCTOR CORPORATION, Hsinchu (TW)

(72) Inventor: Ping-I Chang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/177,256

(22) Filed: Feb. 17, 2021

(65) Prior Publication Data
US 2021/0356986 A1     Nov. 18, 2021

(30) Foreign Application Priority Data

May 18, 2020  (TW) .................................. 109116442

(51) Int. Cl.
*G06F 1/12*       (2006.01)
*H03L 7/07*       (2006.01)
*G06F 1/08*       (2006.01)

(52) U.S. Cl.
CPC .................. *G06F 1/12* (2013.01); *G06F 1/08* (2013.01); *H03L 7/07* (2013.01)

(58) Field of Classification Search
None
See application file for complete search history.

(56) References Cited

U.S. PATENT DOCUMENTS

| 4,868,514 A | * | 9/1989 | Azevedo ............... H03L 7/0814 327/159 |
| 8,917,806 B1 | | 12/2014 | Huang et al. |
| 9,471,091 B2 | | 10/2016 | Dally et al. |

FOREIGN PATENT DOCUMENTS

| TW | I512426 B | 12/2015 |
| TW | I530102 B | 4/2016 |

OTHER PUBLICATIONS

OA letter of the counterpart TW application (appl. No. 109116442) dated May 6, 2021. Summary of the OA letter: 1. Claims 1-6 are rejected as allegedly being unpatentable over cited reference 1 (TW I512426, also published as U.S. Pat. No. 9,471,091 B2) in view of cited reference 2 (TW I530102, also published as U.S. Pat. No. 8,917,806 B2). 2. Claims 7-9 are rejected as allegedly being unpatentable over the cited reference 1 in view of the cited reference 2. 3. Claim 10 is rejected as allegedly being unpatentable over the cited reference 1 in view of the cited reference 2.

* cited by examiner

*Primary Examiner* — Cassandra F Cox
(74) *Attorney, Agent, or Firm* — WPAT, PC

(57) ABSTRACT

A multi-chip system includes a first chip and a second chip. The first chip is configured to generate a first symbol clock signal according to a first clock signal from a first oscillator. The second chip is configured to generate a second symbol clock signal according a second clock signal from a second oscillator, detect a difference between the second symbol clock signal and the first symbol clock signal to generate an error signal, and synchronize the first symbol clock signal and the second symbol clock signal according to the error signal.

20 Claims, 5 Drawing Sheets

MULTI-CHIP SYSTEM, CHIP, AND CLOCK SYNCHRONIZATION METHOD

BACKGROUND OF THE INVENTION

1. Field of the Invention

The present disclosure relates to a multi-chip system. More particularly, the present disclosure relates to a slave chip in a multi-chip system and a clock synchronization method.

2. Description of Related Art

Clock signals of chips in a multi-chip system are required to be synchronized with each other, in order to ensure that data and/or commands can be received correctly. In current approaches, these chips share clock signals that are generated from the same oscillator. However, more chips in the multi-chip system increase the difficulty of layouts and limit the implementations.

SUMMARY OF THE INVENTION

In some embodiments, a multi-chip system includes a first chip and a second chip. The first chip is configured to generate a first symbol clock signal according to a first clock signal from a first oscillator. The second chip is configured to generate a second symbol clock signal according a second clock signal from a second oscillator, detect a difference between the second symbol clock signal and the first symbol clock signal to generate an error signal, and synchronize the first symbol clock signal and the second symbol clock signal according to the error signal.

In some embodiments, a chip includes a synchronization circuitry, a sampling clock generator circuit, and a symbol clock generator circuit. The synchronization circuitry is configured to detect a difference between a first symbol clock signal and a second symbol clock signal to generate an error signal, wherein the first symbol clock signal is generated by a master chip according to a first clock signal from a first oscillator. The sampling clock generator circuit is configured to generate a sampling clock signal according to a second clock signal from a second oscillator. The symbol clock generator circuit is configured to generate the second symbol clock signal that is synchronized with the first symbol clock signal according to the sampling clock signal.

In some embodiments, a clock synchronization method includes the following operations: receiving a first symbol clock signal from a master chip, in which the master chip is configured to generate the first symbol clock signal according to a first clock signal from a first oscillator; generating a second symbol clock signal according to a second clock signal from a second oscillator; and detecting a difference between the second symbol clock signal and the first symbol clock signal to generate an error signal, in order to adjust the second symbol clock signal according to the error signal to synchronize the second symbol clock signal with the first symbol clock signal.

These and other objectives of the present disclosure will be described in preferred embodiments with various figures and drawings.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not explicitly stated.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuitry" may indicate a system formed with one or more circuits. The term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

Figure 1:
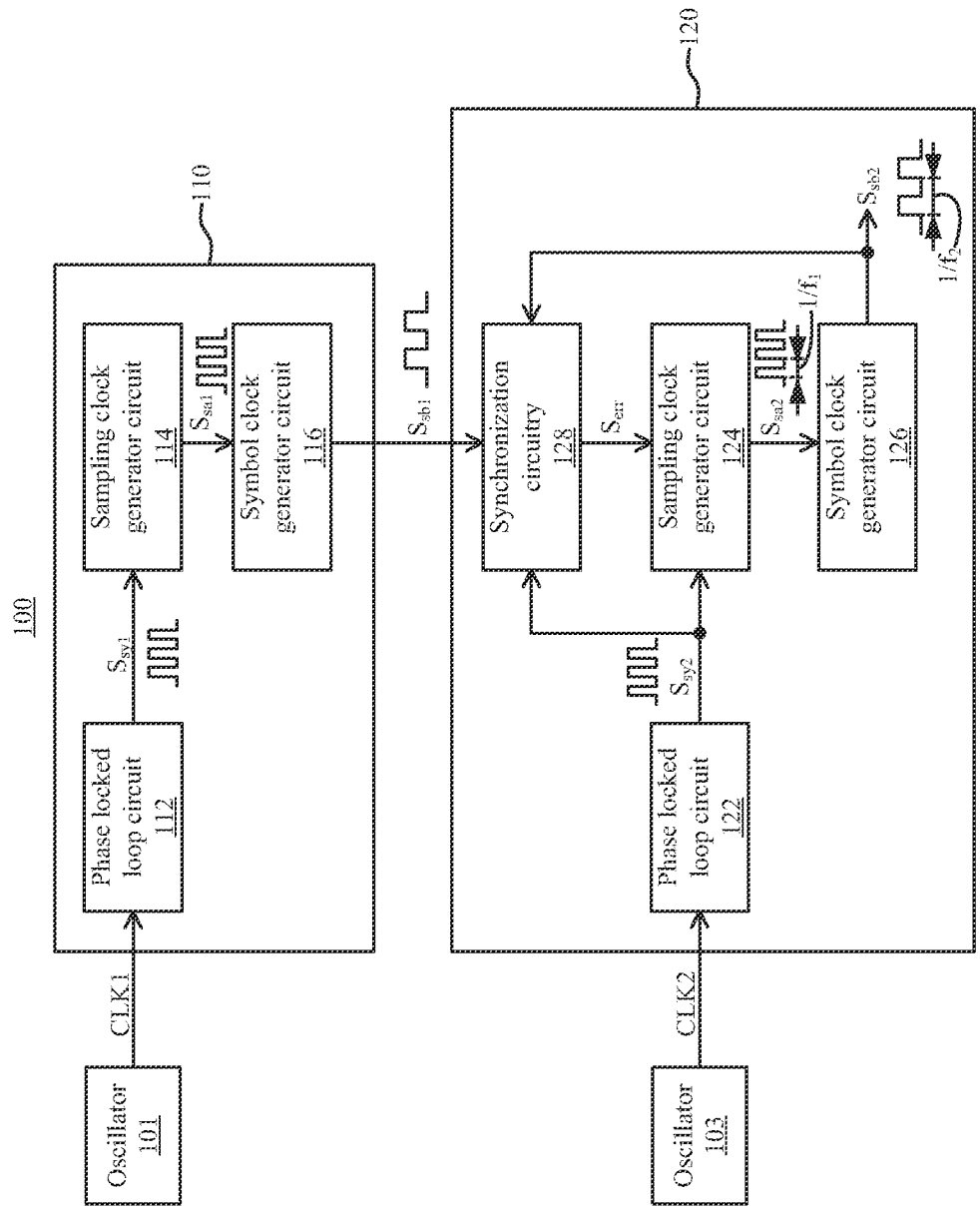
FIG. 1 is a schematic diagram of a multi-chip system according to some embodiments of the present disclosure.

FIG. 1 is a schematic diagram of a multi-chip system 100 according to some embodiments of the present disclosure. In some embodiments, the multi-chip system 100 may be applied to (but not limited to) a digital storage oscillator (DSO) or communication devices arranged in different sever rooms.

The multi-chip system 100 includes an oscillator 101, an oscillator 103, a chip 110, and a chip 120. The oscillator 101 and the oscillator 103 are two different oscillators, which are configured to generate a clock signal CLK1 and a clock signal CLK2, respectively. In some embodiments, each of the oscillator 101 and the oscillator 103 may be (but not limited to) a crystal oscillator. In this example, the chip 110 operates as a master chip, and the chip 120 operates as a slave chip. In order to ensure that data and/or commands can be correctly transferred, a clock signal (e.g., a symbol clock signal $S_{sb2}$) of the chip 120 is configured to be synchronized with a clock signal (e.g., a symbol clock signal $S_{sb1}$) of the chip 110. The chip 110 is coupled to the oscillator 101 to receive the clock signal CLK1 and generates the symbol clock signal $S_{sb1}$ according to the clock signal CLK1. The chip 120 is coupled to the chip 110 and the oscillator 103 in order to receive the symbol clock signal $S_{sb1}$ and the clock signal CLK2, respectively. The chip 120 generates the symbol clock signal $S_{sb2}$ according to the clock signal CLK2, and detects a difference between the symbol clock signal $S_{sb2}$ and the symbol clock signal $S_{sb1}$ to generate an error signal $S_{err}$, in order to adjust the symbol clock signal $S_{sb2}$ according to the error signal $S_{err}$. As a result, the symbol clock signal $S_{sb2}$ is kept being synchronized with the symbol clock signal $S_{sb1}$.

The following paragraphs will describe several embodiments about the chip 110 and/or the chip 120, but the present disclosure is not limited thereto.

As shown in FIG. 1, the chip 110 includes a phase locked loop circuit 112, a sampling clock generator circuit 114, and a symbol clock generator circuit 116. The phase locked loop circuit 112 generates a system clock signal $S_{sy1}$ according to the clock signal CLK1. In some embodiments, the phase locked loop circuit 112 keeps the system clock signal $S_{sy1}$ being synchronized with the clock signal CLK1 based on a negative feedback mechanism (not shown). In some embodiments, the phase locked loop circuit 112 may include (but not limited to), a phase detector circuit (not shown), a voltage controlled oscillator circuit (not shown), and/or a frequency divider circuit (not shown), in which the above circuits are arranged to form the above negative mechanism.

The sampling clock generator circuit 114 is coupled to the phase locked loop circuit 112 to receive the system clock signal $S_{sy1}$. The sampling clock generator circuit 114 generates a sampling clock signal $S_{sa1}$ according to the system clock signal $S_{sy1}$. In some embodiments, the sampling clock generator circuit 114 may include (but not limited to) a delay circuit (not shown), a multiplexer circuit (not shown), and/or a phase interpolator circuit (not shown). The delay circuit may delay the system clock signal $S_{sy1}$ to generate clock signals having different phases. The multiplexer circuit may select at least two signals from the clock signals to generate output signals, and may provide the output signals to the phase interpolator circuit. The phase interpolator circuit may generate the sampling clock signal $S_{sa1}$ based on the output signals. The arrangements about the sampling clock generator circuit 114 are given for illustrative purposes, and the present disclosure is not limited thereto. In some other embodiments, the sampling clock generator circuit 114 may be an all digital phase locked loop.

The symbol clock generator circuit 116 is coupled to the sampling clock generator circuit 114 to receive the sampling clock signal $S_{sa1}$. The symbol clock generator circuit 116 generates the symbol clock signal $S_{sb1}$ according to the sampling clock signal $S_{sa1}$. In some embodiments, the sampling clock signal $S_{sa1}$ is configured to set time intervals between data sampling actions (i.e., set data sampling rate), and the symbol clock signal $S_{sb1}$ is configured to set a time interval for the chip 110 to process one datum. In some embodiments, a frequency of the sampling clock signal $S_{sa1}$ is higher than a frequency of the symbol clock signal $S_{sb1}$. In some embodiments, the symbol clock generator circuit 116 may be (but not limited to) implemented with a frequency divider circuit.

The chip 120 includes a phase locked loop circuit 122, a sampling clock generator circuit 124, a symbol clock generator circuit 126, and a synchronization circuitry 128. The phase locked loop circuit 122 generates a system clock signal $S_{sy2}$ according to the clock signal CLK2. In some embodiments, the arrangements of the phase locked loop circuit 122 are similar to those of the phase locked loop circuit 112. In some embodiments, the phase locked loop circuit 122 does not receive the clock signal CLK1 from the oscillator 101.

The sampling clock generator circuit 124 is coupled to the phase locked loop circuit 122 to receive the system clock signal $S_{sy2}$. The sampling clock generator circuit 124 generates a sampling clock signal $S_{sa2}$ according to the system clock signal $S_{sy2}$. In some embodiments, the arrangements of the sampling clock generator circuit 124 are similar to those of the sampling clock generator circuit 114.

The symbol clock generator circuit 126 is coupled to the sampling clock generator circuit 124 to receive the sampling clock signal $S_{sa2}$. The symbol clock generator circuit 126 generates the symbol clock signal $S_{sb2}$ according to the sampling clock signal $S_{sa2}$. In some embodiments, the sampling clock signal $S_{sa2}$ is configured to set time intervals between data sampling actions, and the symbol clock signal $S_{sb2}$ is configured to set a time interval for the chip 120 to process one datum. In some embodiments, the sampling clock signal $S_{sa2}$ is configured to sample data, and an interval of a symbol in the recovered data is substantially equal to a duty cycle of the symbol clock signal $S_{sb2}$. In some embodiments, as shown in FIG. 1, a frequency $f_1$ of the sampling clock signal $S_{sa2}$ is higher than a frequency $f_2$ of the symbol clock signal $S_{sb2}$. In some embodiments, the frequency $f_1$ of the sampling clock signal $S_{sa2}$ may be about 64-8192 times of the frequency $f_2$ of the symbol clock signal $S_{sb2}$. In some embodiments, the symbol clock generator circuit 126 may be (but not limited to) implemented with a frequency divider circuit.

The synchronization circuitry 128 is coupled to the chip 110 to receive the symbol clock signal $S_{sb1}$, and is coupled to the symbol clock generator circuit 126 to receive the symbol clock signal $S_{sb2}$, and is coupled to the phase locked loop circuit 122 to receive the system clock signal $S_{sy2}$. The synchronization circuitry 128 detects a difference between the symbol clock signal $S_{sb1}$ and the symbol clock signal $S_{sb2}$ to generate an error signal $S_{err}$. For example, the synchronization circuitry 128 counts at least one pulse of the system clock signal $S_{sy2}$ according to the symbol clock signal $S_{sb1}$ and the symbol clock signal $S_{sb2}$, in order to generate the error signal $S_{err}$. For example, the synchronization circuitry 128 starts counting the at least one pulse according to one of the symbol clock signal $S_{sb1}$ and the symbol clock signal $S_{sb2}$ (i.e., a signal having the leading phase), and stops counting the at least one pulse according to another one of the symbol clock signal $S_{sb1}$ and the symbol clock signal $S_{sb2}$. Some embodiments and operations about the synchronization circuitry 128 will be described with reference to FIG. 2, FIG. 3A, and FIG. 3B.

In some embodiments, the sampling clock generator circuit 124 is further configured to adjust the sampling clock signal $S_{sa2}$ according to the error signal $S_{err}$. Accordingly, the symbol clock generator circuit 126 may update the symbol clock signal $S_{sb2}$ according to the adjusted sampling clock signal $S_{sa2}$. As a result, the symbol clock signal $S_{sb2}$ is kept being synchronized with the symbol clock signal $S_{sb1}$. For example, the sampling clock generator circuit 124 may include (but not limited to) a delay circuit (not shown), a multiplexer circuit (not shown), and/or a phase interpolator circuit (not shown). The delay circuit may delay the system clock signal $S_{sy2}$ to generate clock signals having different phases. The multiplexer circuit may select at least two signals from the clock signals according to the error signal $S_{err}$ to generate output signals, and may provide the output signals to the phase interpolator circuit. The phase interpolator circuit may generate the sampling clock signal $S_{sa2}$ based on the output signals. The arrangements of the sampling clock generator circuit 124 are given for illustrative purposes, and the present disclosure is not limited thereto.

It is understood that, a number of chips shown in FIG. 1 is given for illustrative purposes, and the present disclosure is not limited thereto. In one or more embodiments, the number of chips in the multi-chip system 100 may be two or more.

In some approaches, various chips in a multi-chip system can share one oscillator to apply clock synchronization. In these approaches, when the number of chips is increased, additional buffer circuit(s) may be employed to be coupled between the chips and the oscillator, in order to increase a driving capability of the oscillator. However, the additional buffer circuit(s) can cause layout difficulties of the multi-chip system on a circuit board, and the overall cost will be increased significantly.

Compared to the above approaches, in some embodiments of the present disclosure, the chips (e.g., the chip 110 and the chip 120) utilize different oscillators (e.g., the oscillator 101 and the oscillator 103), and the clock of one of the chips (e.g., the chip 120 operating as the slave chip) may be synchronized according to a signal generated from another one of the chips (e.g., the chip 110 operating as the master chip). As a result, the number of the buffer circuits can be reduced and the layout difficulties can be lower.

Figure 2:
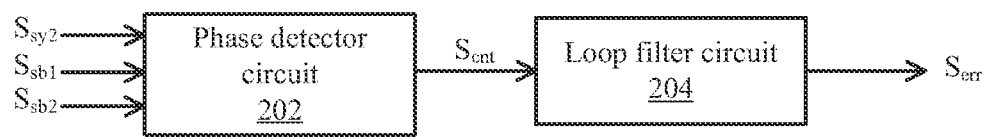
FIG. 2 is a schematic diagram of the synchronization circuitry in FIG. 1 according to some embodiments of the present disclosure.

FIG. 2 is a schematic diagram of the synchronization circuitry 128 in FIG. 1 according to some embodiments of the present disclosure. The synchronization circuitry 128 includes a phase detector circuit 202 and a loop filter circuit 204. The phase detector circuit 202 counts at least one pulse of the system clock signal $S_{sy2}$ according to the symbol clock signal $S_{sb1}$ and the symbol clock signal $S_{sb2}$ in order to generate a count value $S_{cnt}$. The loop filter circuit 204 is coupled to the phase detector circuit 202 to receive the count value $S_{cnt}$. The loop filter circuit 204 filters the count value $S_{cnt}$ to generate the error signal $S_{err}$. In some embodiments, the phase detector circuit 202 may include (but not limited to) a flip flop circuit (not shown) and/or a counter circuit (not shown), and related operations thereof will be described with reference to FIG. 3A and FIG. 3B. In some embodiments, the loop filter circuit 204 may be a low pass filter circuit.

Figure 3A:
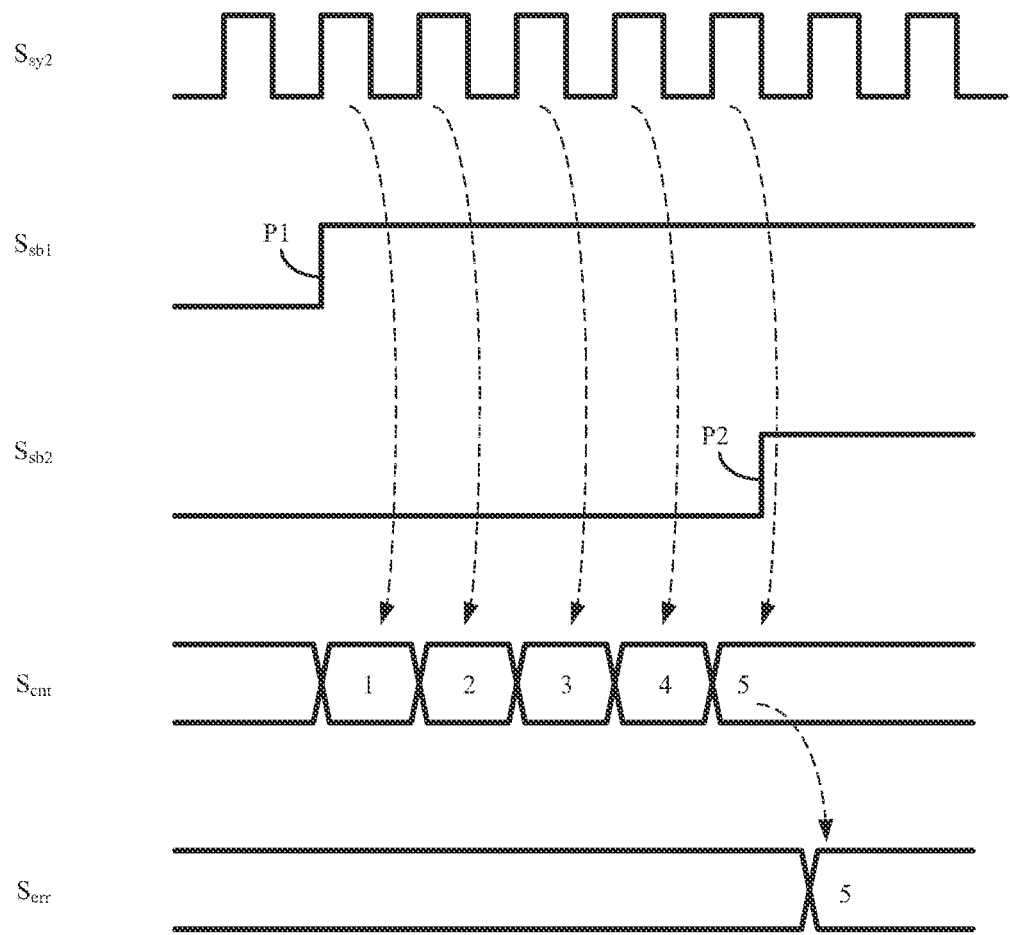
FIG. 3A is a waveform diagram of related signals in FIG. 2 according to some embodiments of the present disclosure.

FIG. 3A is a waveform diagram of related signals in FIG. 2 according to some embodiments of the present disclosure. In this example, the phase of the symbol clock signal $S_{sb1}$ leads the phase of the symbol clock signal $S_{sb2}$. As shown in FIG. 3A, a positive edge P1 of the symbol clock signal $S_{sb1}$ arrives earlier than a positive edge P2 of the symbol clock signal $S_{sb2}$. The phase detector circuit 202 is triggered to start counting at least one pulse of the system clock signal $S_{sy2}$ according to the positive edge P1 the symbol clock signal $S_{sb1}$ in order to generate the count value $S_{cnt}$, and is triggered to stop counting the at least one pulse of the system clock signal $S_{sy2}$ according to the positive edge P2 of the symbol clock signal $S_{sb2}$. As a result, the phase detector circuit 202 detects that the differences between the symbol clock signal $S_{sb1}$ and the symbol clock signal $S_{sb2}$ are five pulses, and outputs the count value $S_{cnt}$ to be 5.

Figure 3B:
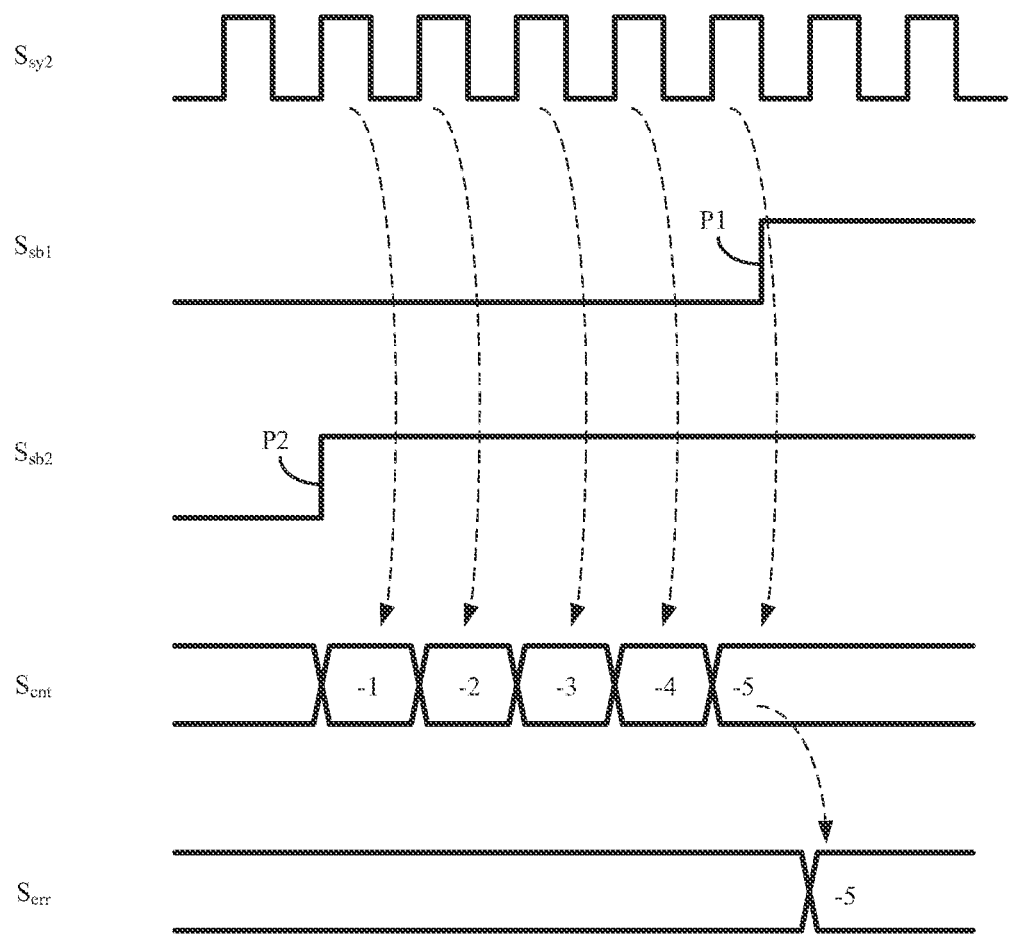
FIG. 3B is a waveform diagram of related signals in FIG. 2 according to some embodiments of the present disclosure.

FIG. 3B is a waveform diagram of related signals in FIG. 2 according to some embodiments of the present disclosure. In this example, the phase of the symbol clock signal $S_{sb1}$ lags behind the phase of the symbol clock signal $S_{sb2}$. As shown in FIG. 3B, the positive edge P2 of the symbol clock signal $S_{sb2}$ arrives earlier than the positive edge P1 of the symbol clock signal $S_{sb1}$. The phase detector circuit 202 is triggered to start counting at least one pulse of the system clock signal $S_{sy2}$ according to the positive edge P2 of the symbol clock signal $S_{sb2}$ to generate the count value $S_{cnt}$, and is triggered to stop counting the system clock signal $S_{sy2}$ according to the positive edge P1 of the symbol clock signal $S_{sb1}$. As a result, the phase detector circuit 202 detects that the differences between the symbol clock signal $S_{sb1}$ and the symbol clock signal $S_{sb2}$ are five pulses, and outputs the count value $S_{cnt}$ to be −5, in which the negative value is to indicate that the phase the symbol clock signal $S_{sb1}$ lags behind the phase of the symbol clock signal $S_{sb2}$.

Figure 4:
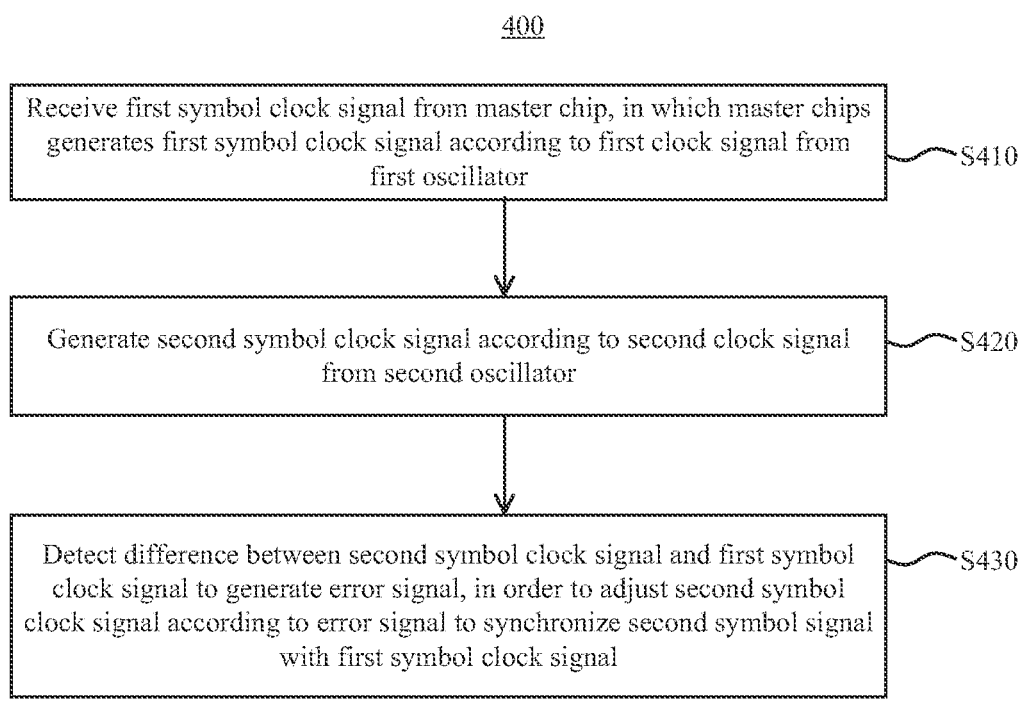
FIG. 4 is a flow chart of a clock synchronization method according to some embodiments of the present disclosure.

FIG. 4 is a flow chart of a clock synchronization method 400 according to some embodiments of the present disclosure. In some embodiments, the clock synchronization method 400 may be (but not limited to) performed by the chip 120 (which operates as a slave chip) in FIG. 1.

In operation S410, a first symbol clock signal is received from a master chip, in which the master chip generates the first symbol clock signal according a first clock signal from a first oscillator. In operation S420, a second symbol clock signal is generated according to a second clock signal from a second oscillator. In operation S430, a difference between the second symbol clock signal and the first symbol clock signal is detected to generate an error signal, in order to adjust the second symbol clock signal according to the error signal to synchronize the second symbol clock signal with the first symbol clock signal.

The above operations of the clock synchronization method 400 can be understood with reference to various embodiments discussed above, and thus the repetitious descriptions are not given. The above description of the clock synchronization method 400 includes exemplary operations, but the operations are not necessarily performed in the order described above. Operations of the clock synchronization method 400 may be added, replaced, changed order, and/or eliminated as appropriate, or the operations are able to be executed simultaneously or partially simultaneously as appropriate, in accordance with the spirit and scope of various embodiments of the present disclosure.

As described above, with the multi-chip system, the chip, and the clock synchronization method in some embodiments of the present disclosure, chips can be clock synchronized by utilizing different oscillators. As a result, the number of buffer circuits and the layout difficulties (and/or difficulty of wire routing) are both reduced.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely some embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A multi-chip system, comprising:
   a first chip configured to generate a first symbol clock signal according to a first clock signal from a first oscillator; and
   a second chip configured to generate a second symbol clock signal and a system clock signal according to a second clock signal from a second oscillator, start counting at least one pulse of the system clock signal according to one of the first symbol clock signal and the second symbol clock signal, and stop counting the at least one pulse according to another one of the first symbol clock signal and the second symbol clock signal to generate an error signal, and synchronize the first symbol clock signal and the second symbol clock signal according to the error signal.

2. The multi-chip system of claim 1, wherein the second chip comprises:
   a phase locked loop circuit configured to generate the system clock signal according to the second clock signal;
   a synchronization circuitry configured to start counting the at least one pulse of the system clock signal according to the one of the first symbol clock signal and the second symbol clock signal and stop counting the at least one pulse according to the another one of the first symbol clock signal and the second symbol clock signal, in order to generate the error signal;
   a sampling clock generator circuit configured to generate a sampling clock signal according to the system clock signal and the error signal; and
   a symbol clock generator circuit configured to generate the second symbol clock signal that is synchronized with the first symbol clock signal according to the sampling clock signal.

3. The multi-chip system of claim 2, wherein the synchronization circuitry comprises:
   a phase detector circuit configured to count the at least one pulse according to the first symbol clock signal and the second symbol clock signal, in order to generate a count value; and
   a loop filter circuit configured to filter the count value to generate the error signal.

4. The multi-chip system of claim 2, wherein a frequency of the sampling clock signal is higher than a frequency of the second symbol clock signal.

5. The multi-chip system of claim 2, wherein the phase locked loop circuit does not receive the first clock signal from the first oscillator.

6. The multi-chip system of claim 1, wherein the first oscillator is different from the second oscillator.

7. The multi-chip system of claim 1, wherein the first chip operates as a master chip, and the second chip operates as a slave master.

8. A chip, comprising:
   a synchronization circuitry configured to detect a difference between a first symbol clock signal and a second symbol clock signal to generate an error signal, wherein the first symbol clock signal is generated by a master chip according to a first clock signal from a first oscillator;
   a sampling clock generator circuit configured to generate a sampling clock signal according to a second clock signal from a second oscillator and the error signal; and
   a symbol clock generator circuit configured to generate the second symbol clock signal that is synchronized with the first symbol clock signal according to the sampling clock signal.

9. The chip of claim 8, wherein a frequency of the sampling clock signal is higher than a frequency of the second symbol clock signal.

10. The chip of claim 8, wherein the first oscillator is different from the second oscillator.

11. The chip of claim 8, further comprising:
    a phase locked loop circuit configured to generate a system clock signal according to the second clock signal,
    wherein the synchronization circuitry is configured to count at least one pulse of the system clock signal according to the first symbol clock signal and the second symbol clock signal to generate the error signal.

12. The chip of claim 11, wherein the synchronization circuitry comprises:
    a phase detector circuit configured to count the at least one pulse according to the first symbol clock signal and the second symbol clock signal, in order to generate a count value; and
    a loop filter circuit configured to filter the count value to generate the error signal.

13. The chip of claim 11, wherein the synchronization circuitry is configured to start counting the at least one pulse according to one of the first symbol clock signal and the second symbol clock signal, and is configured to stop counting the at least one pulse according to another one of the first symbol clock signal and the second symbol clock signal.

14. The chip of claim 11, wherein the phase locked loop circuit does not receive the first clock signal from the first oscillator.

15. A clock synchronization method, comprising:
    receiving a first symbol clock signal from a master chip, wherein the master chip is configured to generate the first symbol clock signal according to a first clock signal from a first oscillator;
    generating a second symbol clock signal and a system clock signal according to a second clock signal from a second oscillator; and
    starting counting at least one pulse of the system clock signal according to one of the first symbol clock signal and the second symbol clock signal and stopping counting the at least one pulse according to another one of the first symbol clock signal and the second symbol clock signal to generate an error signal, in order to adjust the second symbol clock signal according to the error signal to synchronize the second symbol clock signal with the first symbol clock signal.

16. The clock synchronization method of claim 15, wherein generating the second symbol clock signal and the system clock signal according to the second clock signal comprises:
    generating, by a phase locked loop circuit, the system clock signal according to the second clock signal;
    generating, by a sampling clock generator circuit, a sampling clock signal according to the system clock signal; and generating, by a symbol clock generator circuit, the second symbol clock signal according to the sampling clock signal.

17. The clock synchronization method of claim 16, further comprising:
adjusting, by the sampling clock generator circuit, the sampling clock signal according to the error signal.

18. The clock synchronization method of claim 17, wherein starting counting the at least one pulse of the system clock signal according to the one of the first symbol clock signal and the second symbol clock signal and stopping counting the at least one pulse according to the another one of the first symbol clock signal and the second symbol clock signal, in order to generate the error signal comprises:
counting, by a phase detector circuit, the at least one pulse according to the first symbol clock signal and the second symbol clock signal, in order to generate a count value; and
filtering, by a loop filter circuit, the count value, in order to generate the error signal.

19. The clock synchronization method of claim 16, wherein a frequency of the sampling clock signal is higher than a frequency of the second symbol clock signal.

20. The clock synchronization method of claim 15, wherein the first oscillator is different from the second oscillator.

* * * * *